United States Patent [19]

Naito

[11] Patent Number: 4,912,326

[45] Date of Patent: Mar. 27, 1990

[54] DIRECT IMAGING TYPE SIMS INSTRUMENT

[75] Inventor: Motohiro Naito, Tokyo, Japan

[73] Assignee: Jeol Ltd., Tokyo, Japan

[21] Appl. No.: 244,484

[22] Filed: Sep. 14, 1988

[30] Foreign Application Priority Data

Sep. 18, 1987 [JP] Japan ............................... 62-234130

[51] Int. Cl.$^4$ ........................ H01J 37/28; H01J 49/26

[52] U.S. Cl. .................................... 250/309; 250/296

[58] Field of Search ............... 250/296, 281, 299, 398, 250/309

[56] References Cited

U.S. PATENT DOCUMENTS

| | | | |
|---|---|---|---|
| 3,984,682 | 10/1976 | Matsuda | 250/296 |
| 4,521,687 | 6/1985 | Naito | 250/296 |
| 4,588,889 | 5/1986 | Naito | 250/296 |

OTHER PUBLICATIONS

"Microanalyzers Using Secondary Ion Emission", (III. Direct Imaging Instruments), Georges Slodzian, Applied Charged Particle Optics (1980) pp. 17–19.

*Primary Examiner*—Bruce C. Anderson
*Attorney, Agent, or Firm*—Webb, Burden, Ziesenheim & Webb

[57] ABSTRACT

There is disclosed a direct imaging type SIMS (secondary ion mass spectrometry) instrument having a mass analyzer comprising superimposed fields. The superimposed fields consist of a toroidal electric field and a uniform magnetic field substantially perpendicular to the electric field. In said electric field, the central orbit of the ion beam is located in an equipotential plane. The mass analyzer causes an image of the region on the sample bombarded with a primary beam to be focused onto a two-dimensional detector to form a mass-filtered ion image. The SIMS instrument can operate in a mode where only the intensity of the magnetic field of the mass analyzer is set equal to zero. In this mode, only ions having a selected energy within a certain energy bandwidth produce an image, that is, an energy-filtered ion image is formed.

2 Claims, 3 Drawing Sheets

DIRECT IMAGING TYPE SIMS INSTRUMENT

BACKGROUND OF THE INVENTION

The present invention relates to an instrument for conducting secondary-ion mass spectrometry (SIMS) and, more particularly, to a direct imaging type SIMS instrument.

Secondary-ion mass spectrometry involves bombarding a sample with a primary particle beam and analyzing the secondary ions that emanate from the sample surface. The secondary ions are then introduced into a mass analyzer, where they are mass analyzed. As a result, the composition of a microscopic region on the surface of the solid sample can be elucidated. Instruments for conducting SIMS are broadly classified into two types: scanning type which scans an analyzed region with a sharply focused primary beam to obtain an ion image; and direct imaging type which bombards the whole analyzed region with a primary beam of a relatively large diameter and obtaining an ion image on the principle of an ion microscope. In principle, the direct imaging type has a higher sensitivity than the scanning type, because the direct imaging type simultaneously detects the secondary ions emanating from the whole analyzed region.

FIG. 1 shows the ion optics of one example of the direct imaging type SIMS instrument. A primary ion beam $I_1$ produced from an ion source IS has a relatively large diameter. This beam is caused to impinge on the whole analyzed region on a sample S. Secondary ions $I_2$ emanating from this region are sent to a mass analyzer MS through a transfer optics TO. In this mass analyzer, only secondary ions having a certain mass are selected and then projected via a projector lens Lp onto a two-dimensional detector such as a fluorescent screen FS. Thus, an ion image is obtained with the certain mass.

In the ion optics shown in FIG. 1, electrostatic lenses $L_{11}$ and $L_{12}$ are used to form the primary ion beam. The transfer optics TO consists of electrostatic lenses $L_{21}$, $L_{22}$, $L_{23}$. A slit $SL_1$ is disposed at the entrance to the mass analyzer MS. The ion optics further include an intermediate lens LΩ, an energy slit $SL_2$, and a mass selecting slit $SL_3$.

In the instrument shown in FIG. 1, the secondary ions emitted from the sample surface have a large energy spread and, therefore, the mass analyzer MS consists of a double-focusing mass analyzer in which a spherical electric field EF and a uniform sector magnetic field MF are connected in tandem. The direct imaging type SIMS instrument as shown in FIG. 1 is disclosed in pages 17–19 in the third chapter (III. DIRECT IMAGING INSTRUMENTS) in an article "Microanalyzers Using Secondary Ion Emission" by George Slodzian in a book *Applied Charged Particle Optics,* 1980.

In order to satisfy the double-focusing condition for the ion optics, energy aberrations must be made zero for both the crossover and the ion image. To reduce the energy aberration regarding the ion image, (1) an image of the bombarded sample region is formed at the position of the first principal plane of the spherical electric field by the transfer optics TO, (2) the image which has been shifted onto the second principal plane by a spherical electric field is brought onto the first principal plane of the magnetic the magnetic field by the intermediate lens LΩ, and (3) the image which has been shifted onto the second principal plane by the magnetic field is projected onto the screen FS by the projector lens Lp.

To reduce the energy aberration regarding the crossover down to zero, (4) the crossover of an image of the bombarded sample region is brought into the position of the entrance slit $SL_1$ by the transfer optics TO, (5) the crossover formed at the position of the energy slit by the spherical electric field is moved by the intermediate lens LΩ, and (6) the crossover is imaged at the position of the mass-selecting slit $SL_3$ by the magnetic field.

For the aforementioned ion optics, it is inevitable that the mass analyzer is large and complex, because it comprises the tandem arrangement of the electric field, the lens LΩ, and the magnetic field. Also, an adjusting operation for meeting the above-described conditions (1)–(6) for the image and the crossover needs skillfulness and a long time.

In the conventional optics described above, only a mass-filtered ion image is obtained. In such mass-filtered ion image, only selected ions having the specified mass contribute to the formation of the ion image. Therefore, it is impossible to derive any information from such ion image about the other ions not having the specified mass.

SUMMARY OF THE INVENTION

It is an object of the invention to provide an instrument which conducts SIMS, is simple in structure, and needs only a simple adjustment.

It is another object of the invention to provide an instrument which conducts SIMS and can offer energy-filtered ion images as well as mass-filtered ion images.

An instrument according to the invention uses a mass analyzer comprising superimposed magnetic and electric fields which are produced at right angles to each other. This mass analyzer is so adjusted that an image of the region on a sample which is bombarded with a primary beam is focused onto a two-dimensional detector.

Other objects and features of the invention will appear in the course of the description thereof which follows.

DESCRIPTION OF THE PREFERRED EMBODIMENT

Figure 1:
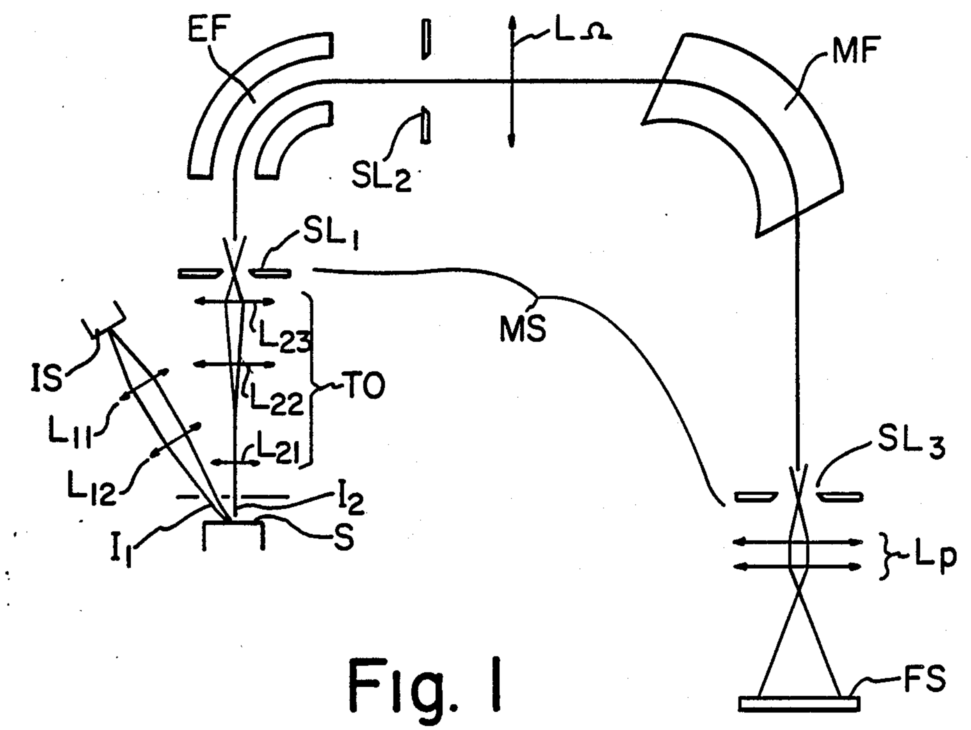
Fig. 1 PRIOR ART
FIG. 1 is a diagram of the ion optics of the prior art direct imaging type SIMS instrument.
Figure 2:
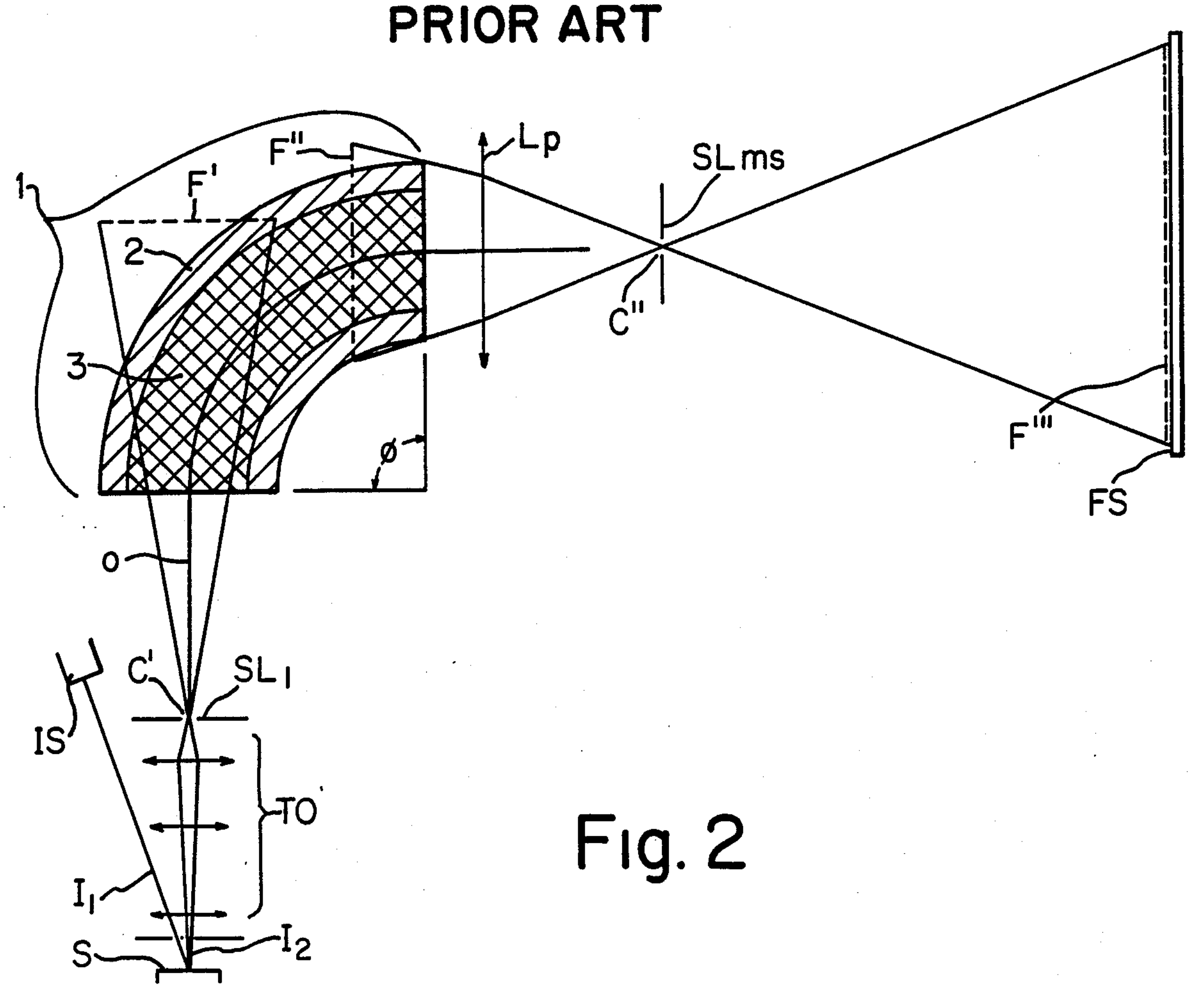
FIG. 2 is a diagram of the ion optics of an instrument according to the invention.

Referring to FIG. 2, there is shown the ion optics of an instrument according to the invention. The ion optics comprises an ion source IS, transfer optics TO, and an entrance slit $SL_1$. A sample S, the ion source IS, the optics TO, and the slit $SL_1$ are arranged in the same manner as in the conventional ion optics shown in FIG. 1. The ion optics further includes superimposed fields consisting of a toroidal electric field 3 and a uniform magnetic field 2 that is substantially perpendicular to the electric field 3. In this electric field 3, the central orbit 0 of the ion beam is located in an equipotential surface. Also shown are a projector lens Lp, a mass-selecting slit SLms, and a fluorescent screen FS.

In the optics shown in FIG. 2, an ion image F′ of the bombarded sample region is formed by the transfer optics TO. This image is changed into an Image F″ by the superimposed fields 1 and then projected as an image F‴ onto the screen FS. The projector lens Lp is used to increase the magnification of the image. This lens Lp can be dispensed with if not necessary.

The crossover C, of the image of the bombarded sample region is formed at the position of the entrance slit $SL_1$ by the transfer optics TO. The superimposed fields create a crossover C″ at the position of the mass-selecting slit SLms. In this state, only mass dispersion takes place at the selecting slit SLms. Only ions of a selected mass which pass through the slit SLms form an ion image of the analyzed region on the fluorescent screen FS. The mass number of ions passing through the slit SLms is changed by varying the intensity of the magnetic field 2 of the superimposed fields 1. In this way, an image can be created from ions having a specified mass number, i.e., a mass-filtered ion image can be obtained.

In order for the optics shown in FIG. 2 to increase the mass separation and to minimize the distortion of the ion image, it is necessary to achieve the double-focusing condition simultaneously for both the crossover and the ion image, moreover, a so-called stigmatic focusing condition is required to be satisfied for the ion image.

Figure 3:
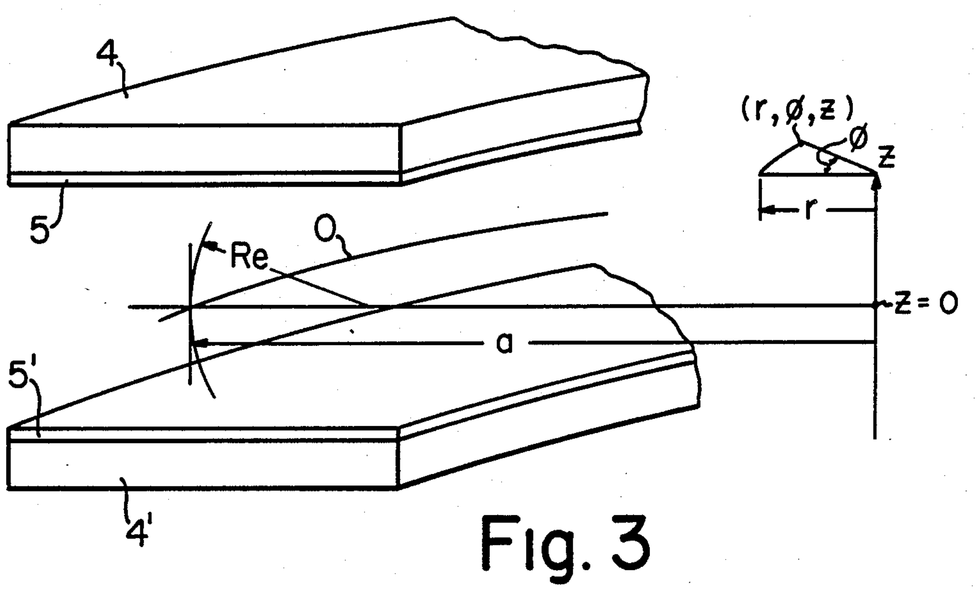
FIG. 3 is a schematic representation of a means for producing superimposed fields.

The motion of ions traveling through superimposed fields consisting of an electric field and a homogeneous magnetic field that is substantially perpendicular to the electric field is now described using a cylindrical coordinate system ( r, $\phi$, z ) as shown in FIG. 3. In the electric field, the central orbit of the ion beam is placed in an equipotential surface as mentioned previously.

FIG. 3 schematically shows a means for producing the superimposed fields. In FIG. 3, a homogeneous magnetic field is produced between a pair of magnetic pole pieces 4 and 4′ along the z-axis. Base plates 5 and 5′ for producing an electric field are positioned on the surfaces of the pole pieces 4 and 4′, respectively. The structure of these base plates 5′ and 5, is described in detail later. A multiplicity of filament electrodes are arranged coaxially on the surface of each base plate. Adequate potentials are applied to these electrodes to produce an electric field substantially perpendicular to the magnetic field between the magnetic pole pieces.

It is now assumed that the electric field on the central orbit 0 (that is, z=0, r=a) has constant strength and has the direction to the center of the curvature of the central orbit 0. To treat electromagnetic fields near the plane z=0 and the radius r=a, we now introduce the relations $$r=a\,(1+\rho) \tag{1}$$

$$z=a\,\zeta \tag{2}$$

where $\rho$ and $\zeta$ are variables which are much smaller than unity.

By first-order approximations, ion orbit equations for determining the orbit of ions in the superimposed fields are given by $$\frac{d^2\rho}{d\phi} = -Kr^2\,\rho + \gamma + \left(2 - \frac{a}{a_m}\right)\beta \tag{3}$$

in the r-direction and $$\frac{d^2\zeta}{d\phi^2} = -Kr^2\,\zeta \tag{4}$$

in the z-direction. The coefficients $Kr^2$ and $Kz^2$ are determined according to the property of the electric and magnetic fields. Where the magnetic field is uniform, these coefficients are given by $$Kr^2 = 3 + l - 3\frac{a}{a_m} + \frac{(a)^2}{a_m} \tag{5}$$

$$Kz^2 = -\left(\frac{a}{a_e} + l\right) \tag{6}$$

The mass m and the velocity v of an ion of interest are given by $$m=m_o\,(2+\gamma) \tag{7}$$

$$v=v_o\,(1+\beta) \tag{8}$$

where $\gamma$ and $\beta$ represent the relative variation rates of the mass m and velocity v of the ions, respectively. $m_o$ and $v_o$ are the mass and velocity of the ions passing through the central orbit, respectively, hereinafter referred to these ions as central beam ions. Given by $a_m$ is the radius of the central beam ions when only the magnetic field exists. Expressed by $a_e$ is the radius of the central beam ions when only the electric field exits. The relations of these radii to the radius a are given by $$\frac{1}{a} = \frac{1}{a_e} + \frac{1}{a_m} \tag{9}$$

The term l included in equations (5) and (6) above is the first-order Taylor expansion coefficient when the electric field is subjected to Taylor expansion about the central orbit and is given by $$l=-(1+C) \tag{10}$$

where C is the ratio of the radius of curvature a of the central orbit and the radius of curvature Re (see FIG. 3) of the equipotential line which passes through the central orbit and the plane included in the z-axis. Thus, $$C=a/Re \tag{11}$$

Further, C is a constant indicating the property of the electric fields. For example, when C=0 (Re=$\infty$), the electric field is cylindrical, when C=1 (Re=a) the electric field is spherical, and when C$\neq$0 and C$\neq$1, the electric field is toroidal.

The coefficient $Kr^2$ determines the first-order converging characteristic of the ion in the r-direction, and the coefficient $Kz^2$ determines the first-order converging characteristic in the z-direction. Using Kr and Kz, the formula, called Newton's formula, relating the position of the crossover in front of the superimposed fields with the focal point can be reduced to the form $$(l'-g)=(l''-g)=f^2 \quad (12)$$

where l' is the distance between the position of the object at which the crossover is formed and the entrance boundary of the superimposed fields, l'' is the distance between the position at which the conjugate image of the above crossover point is formed and the exit boundary of the superimposed fields, f is the focal length of the superimposed fields and given by $$f=(a/K)(1/\sin K\phi) \quad (13)$$

and g is the distance between the principal foci and the boundaries of the superimposed fields and given by $$g=(a/K)\cot K\phi \quad (14)$$

At this time, the magnification of the image is given by $$X=\frac{f}{(l'-g)}=\frac{(l''-g)}{f} \quad (15)$$

The above equations (12)–(15) are common to both the r-direction and the z-direction. These equations become relational expressions concerning the r-direction if K=Kr. They become relational expressions regarding the K=Kz.

The dispersion D at the position of the image in the r-direction is given by $$D=a\delta(1+X) \quad (16)$$

$$\delta=\left\{\gamma+\left(2-\frac{a}{a_m}\right)\beta\right\}/Kr^2 \quad (17)$$

We now discuss the dispersion D. Where $a/a_m=2$, hereinafter referred to as the condition (A), equation (17) is changed into the form $$\delta=\gamma/Kr^2$$

This means that only mass dispersion takes place. For the same mass, dispersion is caused neither by the velocities of ions nor by the energies. Consequently, the double-focusing condition holds at every conjugate object and image. Where $a/a_m=0$, hereinafter referred to as the condition (B), i.e., when the intensity of the magnetic field is zero and $a_m=\infty$, equation (17) takes the form $$\delta=(\gamma+2\beta)/Kr^2$$

At this time, ions undergo the force of the electric field. All ions are dispersed according to only the kinetic energies they possess. From equations (5), (6), and (9), we have the relationship $$Kr^2+Kz^2=1+(a/a_e)^2 \quad (18)$$

It can be seen from equation (9) that the relation $a/a_m=2$ included in the condition (A) means $$a/a_e=-1 \quad (19)$$

and that the relation $a/a_m=0$ included in the condition (B) means $$a/a_e=+1 \quad (20)$$

Therefore, under both conditions (A) and (B), equation (18) can be changed into the form $$Kr^2=Kz^2=2 \quad (21)$$

That is, under both conditions (A) and (B), if the relations $Kr^2=Kz^2=1$ are fulfilled, then the stigmatic focusing condition is met.

The condition (A) comprises equations $a/a_m=2$ and $a/a_e=-1$. These two equations are substituted into equations (5) and (6), respectively, to give rise to the relationships $$Kr^2=l+1 \text{ and } Kz^2=1-l$$

It can be understood, therefore, that when l=0, the relations $Kr^2=Kz^2=1$ hold. In order to cater for the relation l=0, the equation $C=-1$ is derived from equation (10). Then from equation (11), the relation $Re=-a$ is required to be satisfied. As shown in FIG. 3, this means that the curvature of radius a is provided in a direction opposite to the direction of the curvature in FIG. 2.

The two equations $a/a_m=0$ and $a/a_e=1$ included in the condition (B) are substituted into equations (5) and (6), respectively. We now get the relations $Kr^2=3+l$ and $Kz^2=-(1+l)$. It can be seen that when l=2, the relationship $Kr^2=Kz^2=1$ hold. To satisfy the relation $l$ equals −2, we obtain the relation C=1 from equation (10). From equation (11), we have the relationship Re=a. This means that the radius of curvature Re shown in FIG. 2 is set equal to a.

Figure 4:
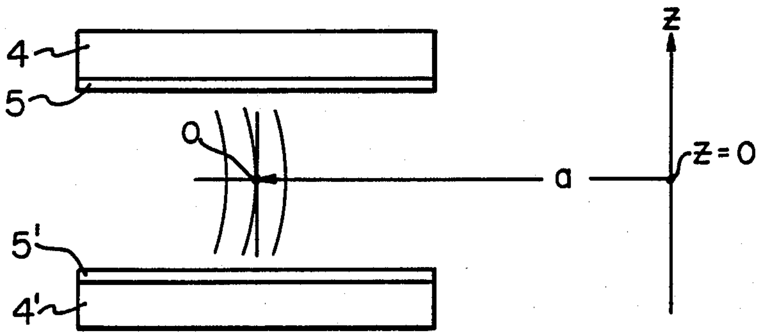
FIG. 4 is a diagram for illustrating the distribution of a toroidal electric field under the condition of 1−0.

In summary, (A), the intensity of the magnetic field and the intensity of the electric field are so set that the relations $a/a_m=2$ and $a/a_e=-1$ hold. Also, the distribution of the electric field is produced as shown in FIG. 4 so as to meet the relation l −0. Further, the values of the distances l', l'', and the focal length f are selected in such a way that the image of the crossover C' formed at the position of the entrance slit shown in FIG. 2 is formed as C'' at the position of the mass-selecting slit SLms. The fluorescent screen FS is placed at the position where the ion image is focused. Under this condition, the mass-filtered ion image projected on the screen FS involves a minimum of distortion. That is, regarding the ion image, the freedom from energy aberration and the stigmatic focusing are simultaneously attained. The magnification of this ion image can be set at any desired value without changing the conditions of the superimposed fields by varying the conditions of the transfer optics TO and varying the size of the crossover formed at the position of the entrance slit. Also, it is possible to obtain mass-filtered ion images from various ions, because ions of various masses are allowed to pass through the mass-selecting slit SLms by changing the intensity of the magnetic field of the superimposed fields.

(B) The distances l', l'', and the focal length f are set in the same manner as in the case of (A). The intensity of the magnetic field is set equal to zero such that the relation $a/a_m=0$ holds. The electric field is produced in a direction opposite to the direction of the field generated in the case of (A) so that the relation $a/a_e=1$ holds; the intensity of the electric field is the same as in the case of (A). The distribution of the electric field is determined to fulfill the relation =2. Thus, a crossover image is focused such that an energy dispersion occurs at the position of the mass-selecting slit SLms. Ions within the selected energy bandwidth pass through this slit and produce an energy-filtered ion image on the fluorescent screen FS. That is, ions having various masses contribute to the formation of the energy filtered ion image. Therefore, it can be said that the energy-filtered ion image contains more general information than those in which the mass-filtered ion image contains.

If the ratio $a/a_e$ is set to an intermediate value between the conditions (A) and (B), i.e., $-1<a/a_e<1$, then a mass-filtered ion image and an energy-filtered ion image are superimposed. In this intermediate region, however, $Kr^2$ and $Kz^2$ are smaller than unity and so the converging force is weak. For this reason, if both images are focused at the same position, i.e., on the fluorescent screen, it is necessary to add a stigmatic lens.

Figure 6:
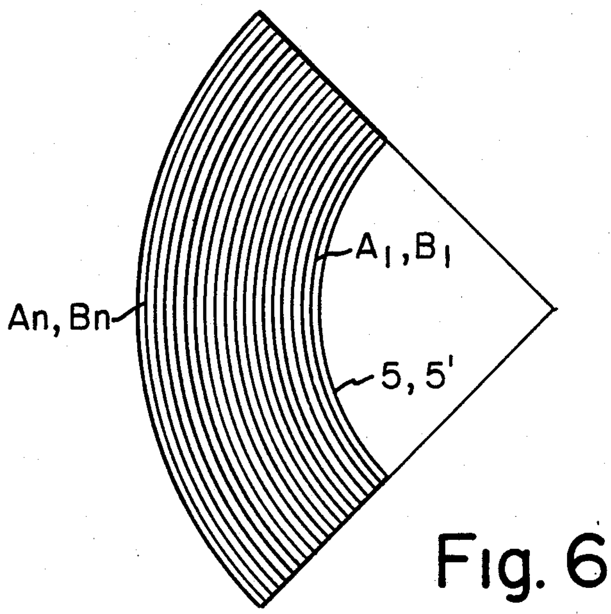
FIG. 6 is a plan view of the base plate 5 or 5′ shown in FIG. 5, for showing its shape.
Figure 5:
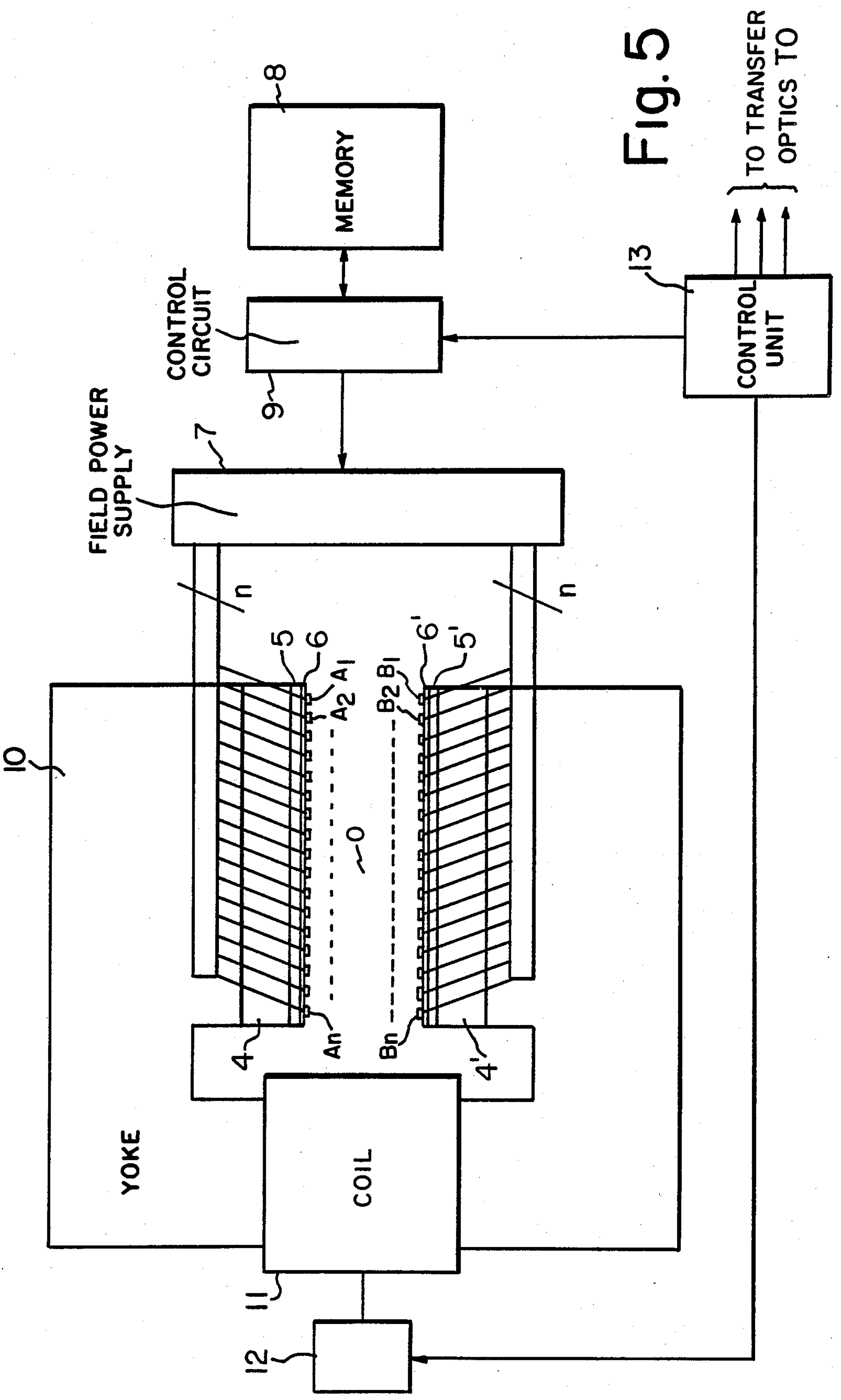
FIG. 5 is a block diagram of a specific example of the superimposed field-producing means shown in FIG. 3.

The structure of a means for producing superimposed fields consisting of an electric field satisfying either the condition $l=0$ or the condition $l=-2$ and a uniform magnetic field is now described in detail. Referring to FIG. 5, base plates 5 and 5' are made from an insulator such as a ceramic and take the form of an arc extending along the central orbit of ions as shown in FIG. 6. Thin resistor coatings 6 and 6, are formed on the opposite surfaces of the base plates 5 and 5', respectively, by applying a material to the surfaces or by evaporation. A multiplicity of electrodes $A_1$–An and $B_1$–Bn of 0.1 mm wide, for example are arranged coaxially on the arc-shaped coatings. The electrodes are spaced 1.5 mm, for example, from each other. The pattern of the electrodes can be created by applying or depositing a conductive material using a mask, for example. Alternatively, the pattern can be created by resist exposure techniques or etching techniques in the same manner as ordinary printed circuit boards. A field power supply 7 applies a certain voltage to each electrode on the base plates via a lead wire. The values of voltages to be applied to all the electrodes $A_1$–An and $B_1$–Bn are stored in a memory 8. A reading control circuit 9 causes the voltage values to be read from the memory 8 and supplied to the power supply 7 as information about the voltages applied to the electrodes.

A yoke 10 extends across the magnetic pole pieces 4 and 4', and is excited by an exciting coil 11 which receives exciting current from a magnetic field power supply 12. The operation of the reading control circuit 9, the electric field power supply 7, the magnetic field power supply 12, and the transfer optics TO is controlled by a control unit 13.

The superimposed field-producing means constructed as described above is able to set up a toroidal electric field having a desired coefficient C between the electrodes by setting a voltage to be applied to each electrode in accordance with a predetermined formula. The coefficient l that is determined from equation (10) can be set to any desired value, using the coefficient C.

Information about the potentials on the electrodes which produce a preset toroidal electric field with $l=0$ ($C=-1$) is stored in the memory 8. Also, other information about the potentials on the electrodes which generate a toroidal electric field with $l=-2$ ($C=1$) is stored in the memory 8.

When the condition (A) described above is selected to establish a mass-filtered ion image mode, the control unit 13 instructs the reading control circuit 9 to read information about the toroidal electric field with $l=0$ from the memory 8. Then, the toroidal electric field is produced according to the information. At the same time, the control unit 13 causes the magnetic field power supply 12 to produce a uniform magnetic field of a given strength.

When the condition (B) is selected to establish an energy-filtered ion image mode, the control unit 13 directs the reading control circuit 9 to read information concerning the toroidal electric field with $l=-2$ from the memory 8. Then, the toroidal field is set up according to the information. At this time, the magnetic field power supply 12 deenergizes the exciting coil 11 to set the intensity of the magnetic field equal to zero.

In this way, the instrument can be switched between the mass-filtered ion image mode and the energy-filtered ion image mode in observing an image of the sample. In either mode, the magnification of the image can be changed by appropriately setting the combination of the intensities of the lenses included in the transfer optics TO using the control unit 13 and varying the crossover size formed at the position of the entrance slit. When the instrument is operated practically, an energy-filtered ion image containing a large amount of information is first formed. A region of interest is found while observing the image of the sample. Then, the mode of operation is switched to the mass-filtered ion image mode. Finally, an ion image of the region is obtained.

Having thus described my invention with the details and particularity required by the Patent Laws, what is claimed and desired protected by Letters Patent is set forth in the following claims.

What is claimed is:

1. A direct imaging type SIMS instrument comprising:

a beam source for producing and directing a primary beam toward a sample position to cause emanation of secondary ions from a sample at said position;

a mass analyzer into which are introduced secondary ions emanating from a sample at the sample position by the bombardment of the primary beam, the mass analyzer comprising a magnetic field and an electric field superimposed on the magnetic field, the electric field being perpendicular to the magnetic field wherein secondary ions entering the mass analyzer are caused to traverse a circular orbit, one selected orbit being the central ion orbit, said magnetic field being generated by an exciting coil wrapped around a yoke terminating in two facing pole pieces having substantially flat and parallel facing surfaces on each side of the central ion orbit and said electric field being generated by applying electrical potentials to a plurality of concentric electrodes attached to surfaces of insulating base plates positioned substantially parallel to the facing surfaces of the magnetic pole pieces, a two-dimensional detector disposed on the output side of the mass analyzer for displaying an image of the bombarded region on the sample focused onto the detector, and means for switching between at least two modes, a first mode wherein the electric and magnetic fields are so balanced to produce a mass-filtered ion image at the two-dimensional detector and a second mode wherein the intensity of the magnetic field is set to zero and the intensity of the electric field is adjusted to produce an energy filtered image at the two-dimensional detector.

2. A direct imaging type SIMS instrument comprising:

a beam source for producing and directing a primary beam toward a sample position to cause emanation of secondary ions from a sample at said position;

a mass analyzer into which are introduced secondary ions emanating from a sample at the sample position by the bombardment of the primary beam, the mass analyzer comprising a magnetic field and an electric field superimposed on the magnetic field, the electric field being perpendicular to the magnetic field wherein secondary ions entering the mass analyzer are caused to traverse a circular orbit, one selected orbit being the central ion orbit having radius a, a two-dimensional detector disposed on the output side of the mass analyzer for displaying an image of the bombarded region on the sample focused onto the detector, means for switching between at least two modes, a first mass-filtered ion image mode wherein the electric and magnetic fields the intensity of the magnetic field and the intensity of the electric field are set such that $$a/a_m=2 \text{ and } a/a_e=-1$$

where $a_m$ is the ion path radius due to the magnetic field alone and $a_e$ is the ion path radius due to the electric field alone and the electric field is distributed so that $a/Re=-1$ wherein Re is the radius of curvature of the intersection of a plane and the equipotential surface through the central ion orbit wherein said plane passes through the center of curvature and is perpendicular to the plane of the central ion orbit, and an energy-filtered ion image mode wherein the magnetic field is set equal to zero such that $a/a_m=-$ and the electric field is produced such that $a/a_e=1$ and the intensity of the electric field is the same as in the mass-filtered image mode.

* * * * *

UNITED STATES PATENT AND TRADEMARK OFFICE

CERTIFICATE OF CORRECTION

PATENT NO. : 4,912,326 Page 1 of 2

DATED : March 27, 1990

INVENTOR(S) : Motohiro Naito

It is certified that error appears in the above-identified patent and that said Letters Patent is hereby corrected as shown below:

Column 1 Lines 44-45 "mass selecting" should read --mass-selecting--.

Column 1 Line 67 delete "the magnetic" (second occurrence).

Column 2 Line 67 after "fields" insert --1--.

Column 3 Line 13 "C," should read --C'--.

Column 4 Line 26 "2" should read --1--.

Column 5 Line 1 delete "=" (first occurrence).

Column 6 Line 4 "=" (first occurrence) should read --+--.

Column 6 Line 37 "1" should read -- $\ell$--.

UNITED STATES PATENT AND TRADEMARK OFFICE

CERTIFICATE OF CORRECTION

PATENT NO. : 4,912,326

DATED : March 27, 1990

INVENTOR(S) : Motohiro Naito

It is certified that error appears in the above-identified patent and that said Letters Patent is hereby corrected as shown below:

Column 6 Line 65 "=2" should read --$\ell$ = -2--.

Column 7 Line 17 "1" should read --$\ell$--.

Column 7 Line 23 "6," should read --6'--.

Column 7 Line 54 "1" should read --$\ell$--.

Column 7 Line 57 "1" should read --$\ell$--.

Column 7 Line 65 "1" should read --$\ell$--.

Claim 2 Line 16 Column 10 "-" should read --0--.

Signed and Sealed this

Twenty-eighth Day of May, 1991

*Attest:*

HARRY F. MANBECK, JR.

*Attesting Officer* *Commissioner of Patents and Trademarks*